United States Patent [19]

Thommen

[11] Patent Number: 4,764,689
[45] Date of Patent: * Aug. 16, 1988

[54] SAMPLE-AND-HOLD CIRCUIT ARRANGEMENT

[75] Inventor: Werner F. Thommen, Staefa, Switzerland

[73] Assignee: U.S. Philips Corporation, New York, N.Y.

[*] Notice: The portion of the term of this patent subsequent to Jun. 9, 2004 has been disclaimed.

[21] Appl. No.: 53,770

[22] Filed: May 22, 1987

Related U.S. Application Data

[63] Continuation of Ser. No. 861,161, May 9, 1986, Pat. No. 4,672,239.

[30] Foreign Application Priority Data

May 24, 1985 [NL] Netherlands ............... 8501492

[51] Int. Cl.$^4$ ............................................. G11C 27/02
[52] U.S. Cl. ..................................... 307/353; 328/151
[58] Field of Search ................ 307/353, 491, 494; 328/151, 162, 163, 165

[56] References Cited

U.S. PATENT DOCUMENTS

| | | | |
|---|---|---|---|
| 3,516,002 | 6/1970 | Hillis | 307/353 |
| 4,119,960 | 10/1978 | Hill | 328/151 |
| 4,209,717 | 6/1980 | Mahony | 307/353 |
| 4,546,324 | 10/1985 | Bingham et al. | 307/353 |

Primary Examiner—John Zazworsky
Attorney, Agent, or Firm—Thomas A. Briody; David R. Treacy; Bernard Franzblau

[57] ABSTRACT

A sample-and-hold circuit arrangement comprising a differential amplifier (5) followed by an inverting amplifier (8). A third amplifier (12) is provided having a capacitor (14) which connects an output of the third amplifier to its input. The inverting amplifier ensures that the voltage on the output (16) of the arrangement is independent of the offset voltage of the differential amplifier (5). Moreover, during a sampling interval the capacitor (14) maintains the voltage on the output (16) at the value which it had in the directly preceding hold interval.

13 Claims, 1 Drawing Sheet

SAMPLE-AND-HOLD CIRCUIT ARRANGEMENT

This is a continuation of application Ser. No. 861,161, filed May 9, 1986, now U.S. Pat. No. 4,672,239.

BACKGROUND OF THE INVENTION

This invention relates to a sample-and-hold circuit arrangement comprising an input terminal, at least two switches, a capacitor, a differential amplifier and a second amplifier of the inverting type, said second amplifier having an input terminal connected to an output terminal of said differential amplifier. The input terminal of the arrangement is connected to an input of the differential amplifier via one of the switches and an output of the second amplifier is connected to an input of the differential amplifier via the second switch.

Such a sample-and-hold circuit arrangement is known from U.S. Pat. No. 3,696,305. During the hold intervals the output voltage of this circuit arrangement is hardly influenced by the offset voltage of the differential amplifier.

In this respect the offset voltage of the differential amplifier is to be understood to mean that voltage between the inputs of the differential amplifier which yields a zero signal on the output terminal of this amplifier.

However, a disadvantage of the known circuit arrangement is that its output voltage decreases to substantially zero volts during the sampling intervals. If such circuit arrangements are employed, for example, in combination with electrical memories for data processing equipment, it is often desirable that the output voltage of the arrangement during a specific sampling interval remain substantially the same as in the directly preceding hold interval.

SUMMARY OF THE INVENTION

It is an object of the invention to provide a sample-and-hold circuit arrangement of the type defined in the opening paragraph, in which the output voltage during a hold interval is not influenced by the offset voltage of the differential amplifier and in which the output voltage, during a sampling interval, is substantially equal to that during the directly preceding hold interval.

A sample-and-hold circuit arrangement in accordance with the invention is characterized in that the capacitor is arranged in the connection from the first switch to the differential amplifier, and in that the arrangement also comprises a third amplifier having an input connected to the output of the differential amplifier via a third switch. The third amplifier has an output terminal connected, via a fourth switch, to that side (electrode) of the capacitor which is connected to the first switch. The input terminal and the output terminal of the third amplifier are interconnected via a branch including a second capacitor.

An advantage of the circuit arrangement in accordance with the invention is that during a hold interval the output voltage of the arrangement, i.e. the voltage at the output terminal of the third amplifier, is hardly influenced by the offset voltage of the differential amplifier and during a sampling interval the output voltage of the arrangement is substantially the same as in the directly preceding hold interval.

The invention is based on the idea of using the second amplifier only for eliminating the offset voltage of the differential amplifier. The third amplifier, across which the branch including the second capacitor is connected, serves for maintaining the output voltage during a succeeding sampling interval.

In an embodiment of the invention the second amplifier and the third amplifier are constructed in such a way that their transfer characteristics are substantially identical.

An advantage of this improvement is that when the second amplifier and the third amplifier are employed alternately in conformity with the sampling interval and the hold interval respectively, the offset voltage of the differential amplifier is substantially the same in the two intervals. This means that also during the sampling interval the voltage on the output terminal of the third amplifier is practically independent of this offset voltage.

BRIEF DESCRIPTION OF THE DRAWING

The invention will now be described in more detail, by way of example, with reference to the drawing. In the drawing.

DESCRIPTION OF THE PREFERRED EMBODIMENTS

Figure 1:
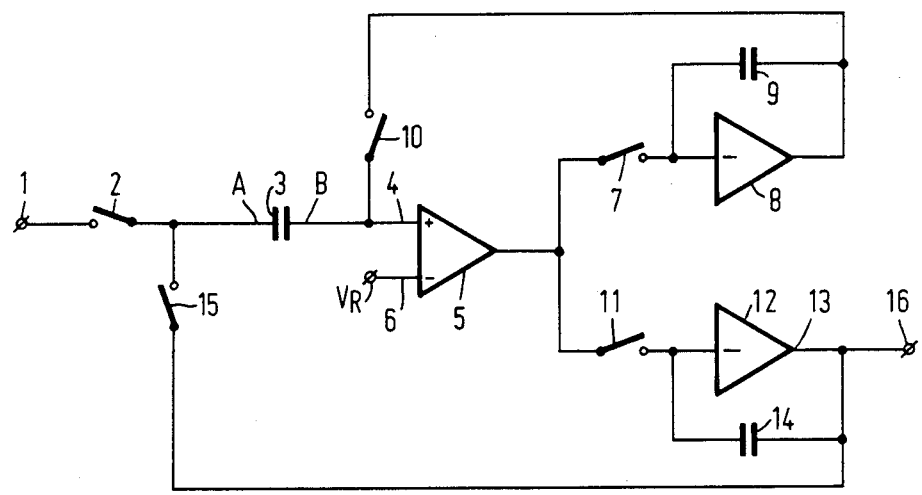
FIG. 1 is a basic diagram of a sample-and-hold circuit arrangement in accordance with the invention.

The arrangement shown in FIG. 1 comprises an input terminal 1 which is connected to the terminal A of a capacitor 3 via a switch 2, the other terminal B of said capacitor being connected to the non-inverting input 4 of a differential amplifier 5, whose inverting input 6 is connected to a point carrying a reference voltage $V_R$. The output terminal of the differential amplifier is connected to an input of a second amplifier 8 of an inverting type via a switch 7, the output of said amplifier 8 being connected to its input by a capacitor 9. This output is also connected to the non-inverting input 4 of the differential amplifier 5 via a switch 10.

Further, the output terminal of the differential amplifier 5 is connected to the input of a third amplifier 12 of an inverting type via a switch 11, the output 13 of this amplifier 12 being connected to its input by a capacitor 14. The output 13 is also connected to the terminal A of the capacitor 3 via a switch 15. The output terminal 16 connected to the output 13 constitutes the output of the circuit arrangement.

The arrangement operates as follows. An analog voltage $V_{IN}$ is applied to the input terminal 1. During a sampling interval the switches 2, 7 and 10 are closed. The other switches are then open. During a hold interval the switches 11 and 15 are closed. The other switches are then open.

In the sampling interval the amplifier 5 is connected to the amplifier 8 to form a voltage follower. Terminal B of the capacitor 3 is then at a potential $V_R + V_{offset}$, where $V_{offset}$ is the offset voltage of the differential amplifier 5. This results in a voltage $V_{IN} - (V_R + V_{offset})$ across the capacitor 3 because the potential on terminal A of the capacitor 3 is $V_{IN}$.

In the succeeding hold interval the amplifier 8 is disconnected from amplifier 5 and the amplifier 12 is connected to the amplifier 5. The input voltage to the differential amplifier 5 is then changed because terminal A of the capacitor 3 (see FIG. 1) is connected to the output 13 of the third amplifier 12. However, the charge on the capacitor 3 remains the same.

The potential on the output 13 and hence that on output terminal 16 now changes until the potential on terminal B is restored to the value during the sampling interval. This also means that the potential on terminal A of the capacitor 3 and hence that on the output 16 is restored to the value $V_{IN}$ in the preceding hold interval.

As a result of the presence of the capacitor 14, $V_{IN}$ on the output 16 is also maintained during the succeeding sampling interval. This will be explained with reference to FIG. 2.

Figure 2:
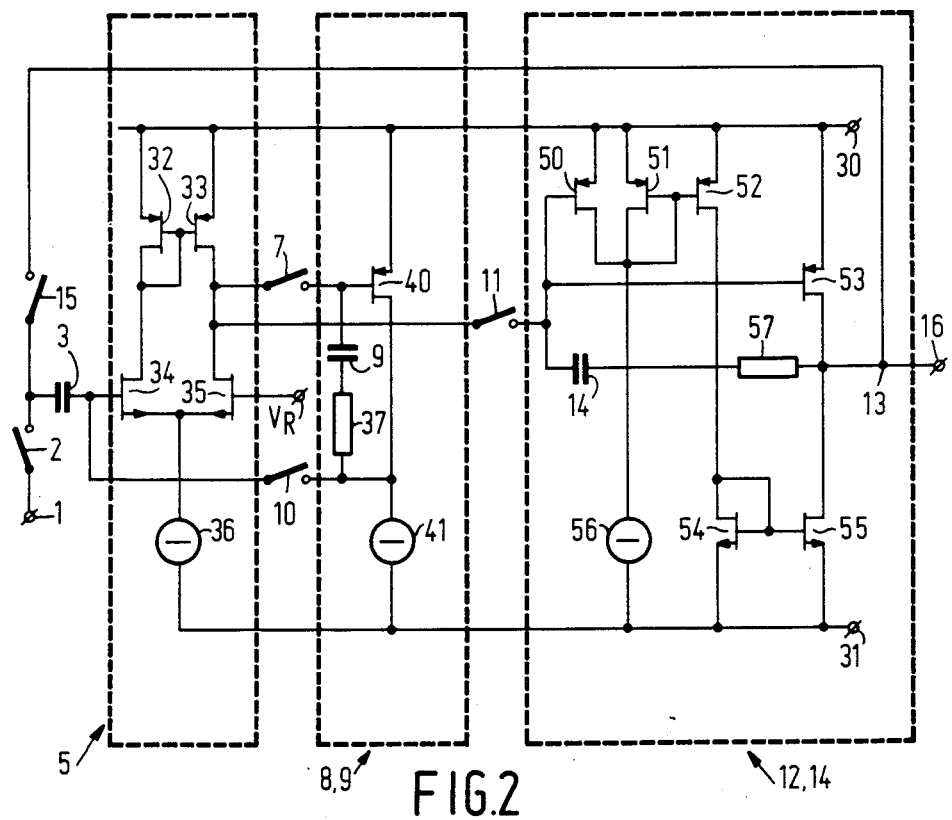
FIG. 2 shows a practical example of the sample-and-hold circuit arrangement shown in FIG. 1.

In FIG. 2, which shows a practical embodiment of the invention, circuit elements corresponding to those in FIG. 1 bear the same reference numerals. The three amplifiers including the capacitors are shown in separate boxes.

The differential amplifier 5 comprises two N-channel MOS transistors 34 and 35 which are arranged as a differential pair whose common-source terminal is connected to the negative power-supply terminal 31 by means of a current source 36. The gate of the transistor 34 is connected to capacitor 3 and the gate of the transistor 35 is connected to a point that supplies a reference voltage $V_R$. The drain of the transistor 34 is connected to the output of the differential amplifier 5 by a current mirror comprising P-channel MOS transistors 32 and 33, and the drain of the transistor 35 is connected directly to said output. By means of a switch 7 said output can be connected to the input of the amplifier 8, which comprises a P-channel MOS transistor 40 loaded by a current source 41. The output of this amplifier is fed back to the input by the series arrangement of a resistor 37 and a capacitor 9. The resistor 37 serves to improve the stability of the amplifier.

The amplifier 12 comprises a P-channel MOS transistor 53 which is driven directly by the output of the amplifier 5 when the switch 11 is closed. An N-channel MOS transistor 55 is arranged in series with the transistor 53 and is driven in phase opposition with the latter. For this purpose the amplifier 12 comprises a first current mirror comprising P-channel MOS transistors 51 and 52. The current gain of this current mirror is, for example, two. The input of this current mirror is connected to a current source 56 and to the drain of a P-channel MOS transistor 50 arranged in parallel with the transistor 51. The area of this transistor 50 is, for example, 1/5 of that of the transistor 51. The output of the first current mirror is connected to the input of a second current mirror comprising the transistors 54 and 55. The current gain of this current mirror is, for example, ten. The output 13 of the amplifier 12 is connected to the input of the amplifier 12 by the series arrangement of a resistor 57 and a capacitor 14. The resistor 57 serves to improve the stability of the amplifier.

If the current from the current source 56 is 25 $\mu$A, the negative feedback via the resistor 57 and the capacitor 14 ensures that the voltage on the input assumes a value such that the quiescent current through the transistors 53 and 55 is substantially 100 $\mu$A. The current from the current source 56 is then distributed between the transistors 50 and 51 in such a way that the current in the transistor 50 is 20 $\mu$A and that in the transistor 51 is 5 $\mu$A. The voltage on the input of the amplifier 12 can now increase until the transistor 50 is cut off and the transistor 51 carries the full current from the current source 56. The maximum output current is then 500 $\mu$A, which is relatively large in comparison with the quiescent current.

As already stated in the description with reference to FIG. 1, the switches 7 and 11 are closed alternately, so that voltage is applied alternately to the capacitor 9 and the capacitor 14.

The voltage on the capacitor 14 is maintained during a sampling interval. Consequently, the potential on the output 13 is maintained during the sampling interval.

In the present example the reference voltage $V_R$ is approximately 5 V,
the capacitor 3 is approximately 10 pF,
the capacitor 9 is approximately 10 pF,
the capacitor 14 is approximately 10 pF,
the resistor 37 is approximately 20 kOhms, and
the resistor 57 is approximately 20 kOhms,
the current sources 36 and 41 are approximately 25 $\mu$A.

The switches 2, 7, 10 and 15 may be, for example, solid-state switching devices. The switches 2 and 15 may be combined to form a change-over switch.

In the embodiment of FIG. 2 the offset voltage of the differential amplifier in the switched-in condition of the inverting amplifier 8 is substantially equal to that in the switched-in condition of the amplifier 12. This is because the transfer characteristics of the amplifiers 8 and 12 are substantially identical.

By means of the circuit arrangement shown in the FIGS. an analog voltage (on terminal 1) is converted into a sampled voltage (on terminal 16), which conversion is hardly influenced by the offset voltage of the differential amplifier 5, while during a sampling interval the sampled voltage is maintained at the level which it had in the directly preceding hold interval.

What is claimed is:

1. A sample-and-hold circuit comprising: an input terminal, a differential amplifier, a second amplifier of an inverting type, said second amplifier having an input terminal connected to an output terminal of said differential amplifier, means connecting the input terminal of the circuit to an input of the differential amplifier via a first switch and a first capacitor connected in series, means connecting an output of the second amplifier to said input of the differential amplifier via a second switch, a third amplifier having an input terminal connected to the output terminal of the differential amplifier via a third switch, said third amplifier having an output terminal connected, via a fourth switch, to a junction point between the first capacitor and the first switch, the input terminal and the output terminal of the third amplifier being interconnected via a branch including a second capacitor.

2. A sample-and-hold circuit as claimed in claim 1, characterized in that the second amplifier and the third amplifier have transfer characteristics that are substantially identical.

3. A sample-and-hold circuit as claimed in claim 1 further comprising a fifth switch which connects said input terminal of the second amplifier to said output terminal of the differential amplifier, said third and fifth switches being closed in alternate time intervals.

4. A sample-and-hold circuit as claimed in claim 3 wherein, during a sampling interval, said first, second and fifth switches are closed and the third and fourth switches are open, and during a hold interval, the third and fourth switches are closed and the first, second and fifth switches are open.

5. A sample-and-hold circuit as claimed in claim 4 wherein the differential amplifier comprises a second input connected to a source of reference voltage.

6. A sample-and-hold circuit as claimed in claim 1 further comprising a third capacitor coupled between said output of the second amplifier and the input terminal of the second amplifier.

7. A sample-and-hold circuit as claimed in claim 3 further comprising a third capacitor coupled between said output of the second amplifier and a junction point between the fifth switch and said input terminal of the second amplifier 8. A sample-and-hold circuit comprising: an input terminal, a differential amplifier, a second amplifier of an inverting type, said second amplifier having an input terminal connected to an output terminal of said differential amplifier, means connecting the input terminal of the circuit to an input of the differential amplifier via a first switch and a first capacitor connected in series, said differential amplifier having a second input connected to a source of reference voltage, means connecting an output of the second amplifier to an input of the differential amplifier via a second switch, a third amplifier having an input terminal connected to the output terminal of the differential amplifier via a third switch, said third amplifier having an output terminal connected, via a fourth switch, to a junction point between the first capacitor and the first switch, the input terminal and the output terminal of the third amplifier being interconnected via a branch including a second capacitor.

9. A sample-and-hold circuit as claimed in claim 8 further comprising a fifth switch which connects said input terminal of the second amplifier to said output terminal of the differential amplifier, said third and fifth switches being closed in mutually exclusive time intervals.

10. A sample-and-hold circuit as claimed in claim 9 wherein said second and third amplifiers have substantially identical transfer characteristics, whereby a voltage at the output terminal of the third amplifier is independent of any offset voltage of the differential amplifier.

11. A sample-and-hold circuit as claimed in claim 1 further comprising a circuit output terminal coupled to the output terminal of the third amplifier.

12. A sample-and-hold circuit as claimed in claim 9 wherein said fifth switch is closed and said third switch is open during a sampling interval, and vice versa during a hold interval.

13. A sample-and-hold circuit as claimed in claim 12 further comprising a third capacitor coupled between said output of the second amplifier and the input terminal of the second amplifier.

* * * * *